United States Patent
Li et al.

(10) Patent No.: US 9,674,493 B2
(45) Date of Patent: Jun. 6, 2017

(54) COLOR IMAGE SENSOR WITH METAL MESH TO DETECT INFRARED LIGHT

(71) Applicant: OMNIVISION TECHNOLOGIES, INC., Santa Clara, CA (US)

(72) Inventors: Jin Li, San Jose, CA (US); Yin Qian, Milpitas, CA (US); Gang Chen, San Jose, CA (US); Dyson H. Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 73 days.

(21) Appl. No.: 14/222,901

(22) Filed: Mar. 24, 2014

(65) Prior Publication Data

US 2015/0271377 A1    Sep. 24, 2015

(51) Int. Cl.
*H04N 3/14* (2006.01)
*H04N 9/04* (2006.01)
*H01L 27/146* (2006.01)

(52) U.S. Cl.
CPC ....... *H04N 9/045* (2013.01); *H01L 27/14621* (2013.01); *H01L 27/14627* (2013.01); *H01L 27/14629* (2013.01); *H01L 27/14645* (2013.01); *H01L 27/14649* (2013.01)

(58) Field of Classification Search
None
See application file for complete search history.

(56) References Cited

U.S. PATENT DOCUMENTS

| | | | |
|---|---|---|---|
| 6,292,212 B1* | 9/2001 | Zigadlo | H04N 5/33 250/338.1 |
| 6,825,470 B1* | 11/2004 | Bawolek | G02B 5/201 250/226 |
| 6,852,562 B1 | 2/2005 | Hopper et al. | |
| 8,138,466 B2* | 3/2012 | Hosaka | H04N 5/332 250/208.1 |
| 9,425,227 B1* | 8/2016 | Wang | H01L 27/14621 |
| 2005/0121599 A1* | 6/2005 | Mouli | 250/208.1 |
| 2005/0134697 A1* | 6/2005 | Mikkonen et al. | 348/216.1 |

(Continued)

OTHER PUBLICATIONS

TW 103127824—Taiwan Office Action with English Translation, issued Jan. 13, 2016, 15 pages.

(Continued)

*Primary Examiner* — Twyler Haskins
*Assistant Examiner* — Wesley Chiu
(74) *Attorney, Agent, or Firm* — Blakely Sokoloff Taylor & Zafman LLP

(57) ABSTRACT

An image sensor includes a pixel array with a plurality of pixels arranged in a semiconductor layer. A color filter array including a plurality of groupings of filters is disposed over the pixel array. Each filter is optically coupled to a corresponding one of the plurality of pixels. Each one of the plurality of groupings of filters includes a first, a second, a third, and a fourth filter having a first, a second, the second, and a third color, respectively. A metal layer is disposed over the pixel array and is patterned to include a metal mesh having mesh openings with a size and pitch to block incident light having a fourth color from reaching the corresponding pixel. The metal layer is patterned to include openings without the metal mesh to allow the incident light to reach the other pixels.

14 Claims, 3 Drawing Sheets

(56) References Cited

U.S. PATENT DOCUMENTS

| | | | | |
|---|---|---|---|---|
| 2007/0146512 A1* | 6/2007 | Suzuki | H04N 5/332 | 348/272 |
| 2008/0198454 A1* | 8/2008 | Wang | G02B 5/223 | 359/485.01 |
| 2009/0009621 A1* | 1/2009 | Yamaguchi | H04N 5/33 | 348/222.1 |
| 2009/0268045 A1* | 10/2009 | Sur et al. | | 348/222.1 |
| 2010/0102366 A1* | 4/2010 | Lee | H01L 27/14609 | 257/291 |
| 2010/0220228 A1* | 9/2010 | Otake | H01L 27/14621 | 348/311 |
| 2010/0245616 A1* | 9/2010 | Yoshino | A61B 1/0638 | 348/223.1 |
| 2010/0282945 A1* | 11/2010 | Yokogawa | H01L 27/14621 | 250/208.1 |
| 2011/0181752 A1* | 7/2011 | Nakashima | H04N 9/045 | 348/223.1 |
| 2011/0249157 A1* | 10/2011 | Fredembach | H01L 27/14621 | 348/273 |
| 2013/0155302 A1* | 6/2013 | Moore | H04N 5/335 | 348/302 |
| 2013/0334402 A1* | 12/2013 | Izuha | H01L 27/146 | 250/208.1 |
| 2014/0194748 A1* | 7/2014 | Yamamoto | A61B 5/0059 | 600/473 |
| 2014/0307098 A1* | 10/2014 | Kang | H04N 5/33 | 348/164 |
| 2015/0221691 A1* | 8/2015 | Watanabe | H04N 5/332 | 348/164 |
| 2015/0381907 A1* | 12/2015 | Boettiger | H04N 5/332 | 348/164 |
| 2016/0065926 A1* | 3/2016 | Nonaka | H04N 5/2351 | 348/164 |

OTHER PUBLICATIONS

TW 103127824—Taiwanese Office Action and Search Report, with English Translation, issued Jan. 8, 2016, 15 pages.

* cited by examiner

COLOR IMAGE SENSOR WITH METAL MESH TO DETECT INFRARED LIGHT

BACKGROUND INFORMATION

Field of the Disclosure

The present invention relates generally to imaging. More specifically, examples of the present invention are related to complementary metal oxide semiconductor based image sensors.

Background

Image sensors have become ubiquitous. They are widely used in digital still cameras, cellular phones, security cameras, as well as, medical, automobile, and other applications. The technology used to manufacture image sensors, and in particular, complementary metal-oxide-semiconductor (CMOS) image sensors (CIS), has continued to advance at a great pace. For example, the demands for higher resolution and lower power consumption have encouraged the further miniaturization and integration of these image sensors.

Two fields of applications in which size and image quality are particularly important are security and automotive applications. For these applications the image sensor chip must typically provide a high quality image in the visible light spectrum as well as have improved sensitivity in the infrared and near infrared portions of the light spectrum. For instance, infrared or near infrared image sensors may be used to provide improved visibility and imaging in low light and foggy conditions as well as help detect warmer objects in cooler environments.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
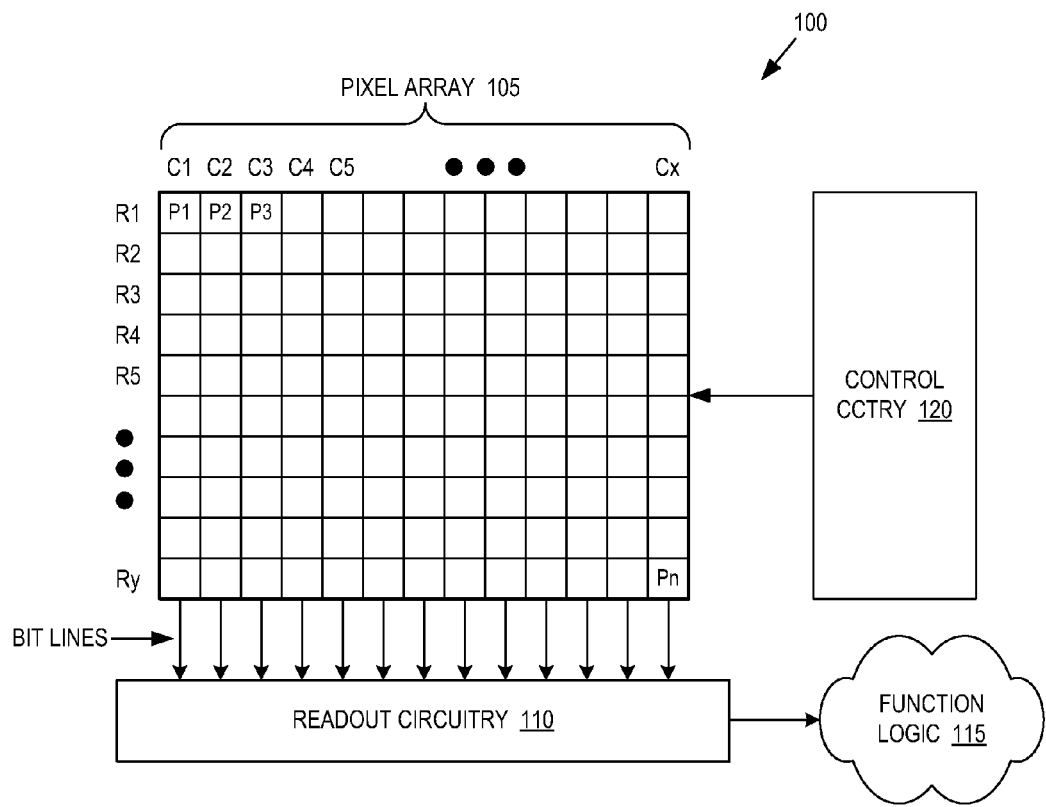
FIG. 1 is a diagram illustrating one example of an image sensor included in an imaging system in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus including a CMOS image sensor with example pixel designs featuring large photodiodes that may have increased sensitivity with reduced image lag are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment," an embodiment, "one example," or "an example" means that a particular feature, structure, or characteristic described in connection with the embodiment or example is included in at least one embodiment or example of the present invention. Thus, the appearances of the phrases such as "in one embodiment" or "in one example" in various places throughout this specification are not necessarily all referring to the same embodiment or example. Furthermore, the particular features, structures, or characteristics may be combined in any suitable manner in one or more embodiments or examples.

As will be discussed, an imaging system including an image sensor is disclosed that can sense visible light as well as infrared light. In one example, the image sensor of the imaging system includes a pixel array having a plurality of pixels arranged in a semiconductor layer. A color filter array including a plurality of groupings of filters is disposed over the pixel array. Each filter in the color filter array is optically coupled to a corresponding one of the plurality of pixels in the pixel array. In one example, each one of the plurality of groupings of filters includes a first, a second, a third, and a fourth filter. In one example, the first filter has a first color, the second and third filters have a second color, and the fourth filter has a third color. A metal layer is also disposed over the pixel array. The metal layer is patterned to include a metal mesh having mesh openings with a size and pitch to block incident light having a fourth color from reaching the corresponding pixel through the third filter of each one of the plurality of groupings of filters in accordance with the teachings of the present invention. The metal layer is patterned to include openings without the metal mesh to allow the incident light to reach the corresponding pixels through the first, second, and fourth filters of each one of the plurality of groupings of filters in accordance with the teachings of the present invention.

To illustrate, FIG. 1 illustrates an example of an image sensor included in a complementary metal oxide semiconductor (CMOS) imaging system 100 including a color pixel array 105, readout circuitry 110, function logic 115, and control circuitry 120. In the depicted example, the example image sensor includes a color pixel array 105 that is a two-dimensional (2D) array of pixels (e.g., pixels P1, P2 . . . , Pn) having X number of pixel columns and Y number of pixel rows. In one example, each pixel is a CMOS imaging pixel. In the example, color pixel array 105 may be implemented as a backside-illuminated image pixel array. As illustrated, each pixel is arranged into a row (e.g., rows R1 to Ry) and a column (e.g., column C1 to Cx) to acquire image data of a person, place, or object, which can then be used to render a 2D image of the person, place, or object. After each pixel has acquired its image data or image charge, the image data is read out by readout circuitry 110 and transferred to function logic 115. Readout circuitry 110 may include amplification circuitry, analog-to-digital (ADC) conversion circuitry, or otherwise. Function logic 115 may simply store the image data or even manipulate the image data by applying post-image effects (e.g., crop, rotate, remove red eye, adjust brightness, adjust contrast, or otherwise). Control circuitry 120 is coupled to pixel array 105 to control operational characteristic of color pixel array 105. For example, control circuitry 120 may generate a shutter signal for controlling image acquisition.

In one example, color pixel array 105 includes a color filter array (CFA), which assigns a color to each pixel of color pixel array 105. In one example, the CFA assigns a separate primary color to each pixel by placing a filter of that color over the pixel. As photons pass through a filter of a certain primary color to reach the pixel, wavelengths of that primary color will pass through that filter. Primary colors are a set of colors identified by science as being the building blocks for all other colors. Examples of primary colors include red, green and blue (commonly referred to as RGB) and cyan, magenta and yellow (commonly referred to as CMY). In the RGB color model, for example, combining varying amounts of red, green and blue will create all the other colors in the visible light spectrum.

Numerous types of CFAs have been developed for different applications. CFA patterns are almost exclusively comprised of identical square pixel elements, referred to as micropixels, arranged in rectangular X, Y patterns. Other pixel shapes may also be used, but repeating pixel units, sometimes referred to as macropixels, are usually found in groupings of four pixels. In many digital camera image sensors, a popular CFA is the Bayer pattern. Using a checkerboard pattern with alternating rows of filters, the Bayer pattern has twice as many green pixels as red or blue pixels, and they are arranged in alternating rows of red wedged between greens, and of blue wedged between greens. This pattern takes advantage of the human eye's predilection to see green luminance as the strongest influence in defining sharpness. What's more, the Bayer pattern produces identical images regardless of how you hold the camera—in landscape or portrait mode.

Figure 2A:
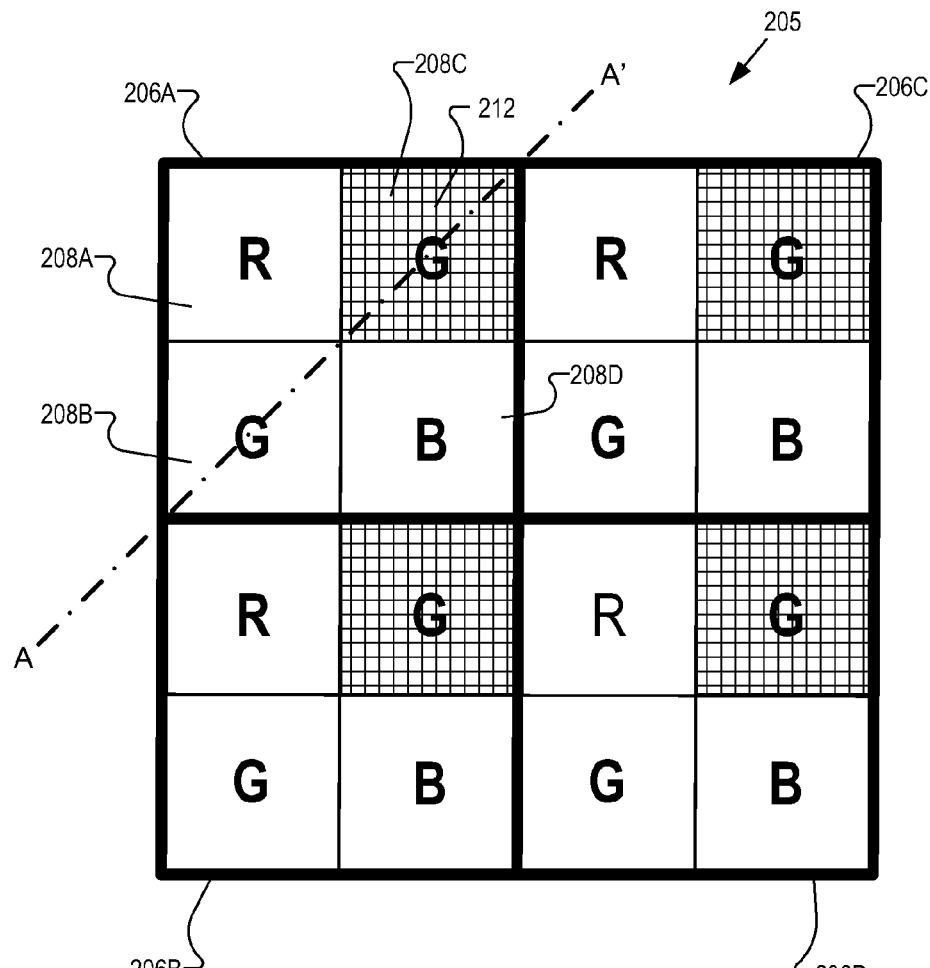
FIG. 2A is a diagram illustrating one example of a portion of a pixel array of an image sensor included in an imaging system in accordance with the teachings of the present invention.

To illustrate, FIG. 2A shows a portion of an example pixel array 205 in increased detail, which includes a CFA arranged in a plurality of groupings of pixels 206A, 206B, 206C, and 206D. It is noted that pixel array 205 of FIG. 2A is an example of a portion of pixel array 105 of FIG. 1 illustrated in higher detail, and that similarly named and numbered elements referenced below are coupled and function similar to as described above. In the depicted example, the CFA over the plurality of groupings of pixels 206A, 206B, 206C, and 206D has a Bayer pattern. In particular, example grouping of pixels 206A includes a first pixel 208A having a red (R) filter, second and third pixels 208B and 208C having green (G) filters, and fourth pixel 208D having a blue (B) filter.

As illustrated in the depicted example, pixel array 205 also includes a metal layer having portions that are patterned to include a metal mesh 212 having mesh openings with a size and pitch to block infrared (IR) light, but allow green (G) incident light to propagate through the metal mesh 212. As shown in the example, the metal mesh is included along the optical path of third pixel 208C. In the example, portions of the metal layer are also patterned to include openings without the metal mesh 212 to allow the incident light, including any infrared (IR) light, to reach the pixel circuitry of corresponding pixels 208A, 208B, and 208D in accordance with the teachings of the present invention.

Figure 2B:
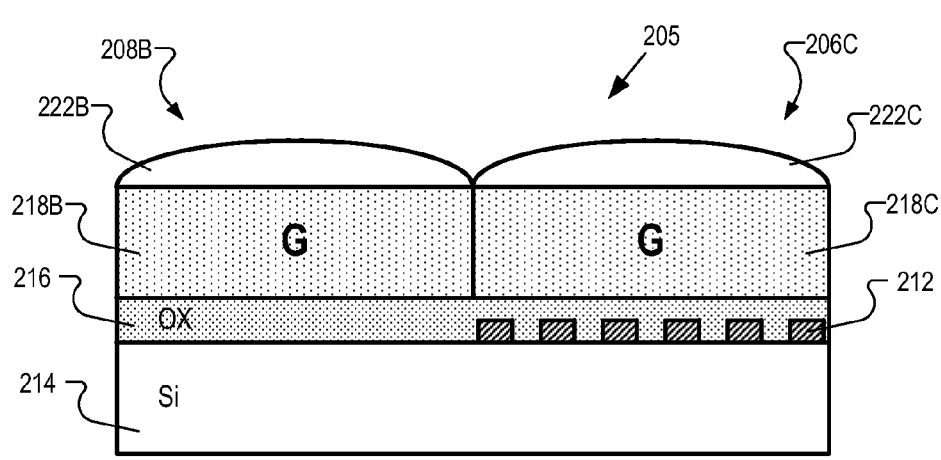
FIG. 2B is a cross-section view of one example of a portion of a pixel array of an image sensor included in an imaging system in accordance with the teachings of the present invention.

To illustrate, FIG. 2B shows a cross-section of example pixel array 205 along dashed line A-A' illustrated in FIG. 2A. In particular, pixel array 205 including pixel 208B and pixel 208C is arranged in a semiconductor layer 214, which in one example includes silicon. A CFA including a color filter 218B and a color filter 218C is disposed over the pixel circuitry in the semiconductor layer 214 of pixels 208B and 208C, respectively. It is noted that an example of the pixel circuitry in the semiconductor layer 214 is described in further detail below in FIG. 3. In the example depicted in FIG. 2B, color filters 218B and 218C are green filters. In the example, each one of the color filters 218B and 218C is optically coupled to a corresponding one of the plurality of pixel circuits arranged in the semiconductor layer 214. In the example, an array of microlenses, including microlenses 222B and 222C, is also disposed over the pixels in semiconductor layer 214. As such, incident light is directed through each microlens 222B and 222C, through respective color filters 218B and 218C, to the respective pixel circuitry arranged in semiconductor layer 214 in accordance with the teachings of the present invention. In one example, the incident light is directed through a back side of an integrated circuit chip including pixel array 205 to illuminate the pixels in pixel array 205 in accordance with the teachings of the present invention.

The example depicted in FIG. 2B also illustrates that a metal layer 216 disposed over the semiconductor layer 214 of the pixel array. In one example, the metal layer 216 disposed within oxide of an interlayer dielectric between the color filters 218B and 218C of the color filter array and the pixel circuitry of the pixel array in the semiconductor layer 214. As shown in the depicted example, portions of the metal layer 216 are patterned to include a metal mesh 212 having mesh openings with a size and pitch to block infrared (IR) incident light from reaching the corresponding pixel circuitry in semiconductor layer 214 through color filter 218C. Thus, metal mesh 212 provides a resonant band pass filter having mesh openings with a size and pitch to reduce the propagation of infrared (IR) light through metal mesh 212 in accordance with the teachings of the present invention. As shown in the example, portions of the metal layer 216 are also patterned to include openings without the metal mesh 212 to allow the incident light to reach the corresponding pixel circuitry in semiconductor layer 214 through the other color filters, including color filter 218B as shown in accordance with the teachings of the present invention.

Figure 3:
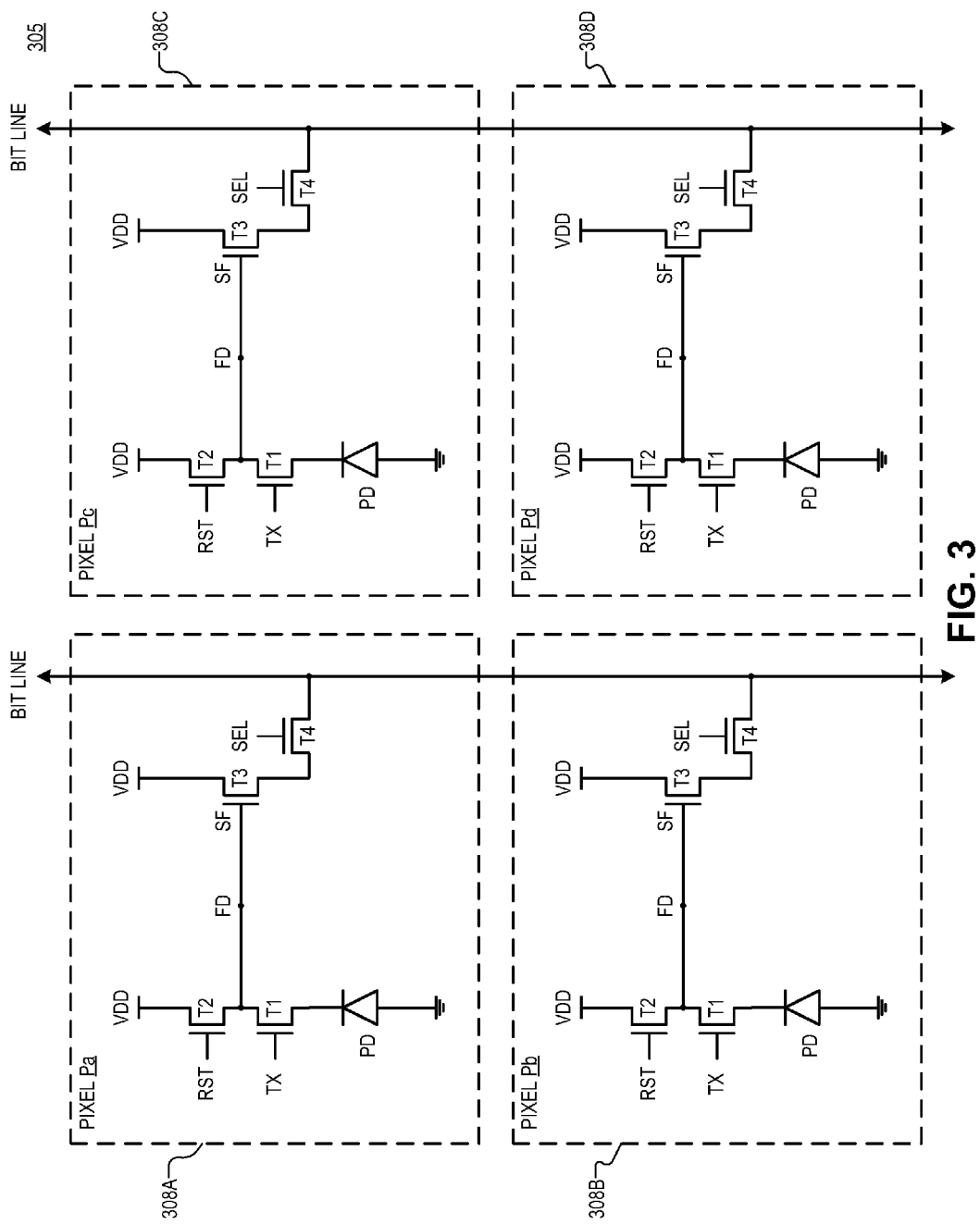
FIG. 3 is a circuit schematic of one example of pixel circuitry of four 4T pixels within a grouping of pixels in pixel array of image sensor included in an imaging system in accordance with the teachings of the present invention.

FIG. 3 is a circuit schematic of one example of pixel circuitry of four 4T pixels within a grouping of pixels in pixel array 305 of image sensor included in an imaging system in accordance with the teachings of the present invention. As shown in the example depicted in FIG. 3, the pixel circuitry in pixel array 305 includes four-transistor (4T) pixel 308A, 308B, 308C, and 308D within pixel array 305. In one example, pixels 308A, 308B, 308C, and 308D represent examples of the pixel circuitry in the semiconductor layer 214 of pixels 208A, 208B, 208C, and 208D of FIGS. 2A-2B in accordance with the teachings of the present invention. Accordingly, similarly named and numbered elements referenced below are coupled and function similar to as described above. It is appreciated that the pixels 308A, 308B, 308C, and 308D represent one possible architecture for implementing each pixel within color pixel array 305 of FIG. 3, but examples in accordance with the teachings of the present invention are not limited to 4T pixel architectures. Indeed, one of ordinary skill in the art having the benefit of the instant disclosure will understand that the present teachings are also applicable to 3T designs, 5T designs, and various other pixel architectures.

In the example depicted in FIG. 2, pixels 308A, 308B, 308C, and 308D are arranged in two rows and two columns. The illustrated example of each pixel in pixel array 305 includes a photosensitive element PD, a transfer transistor T1, a reset transistor T2, a source-follower (SF) transistor T3 and a select transistor T4. During operation of each pixel, transfer transistor T1 receives a transfer signal TX, which transfers the charge accumulated in photosensitive element PD to a floating diffusion node FD. Reset transistor T2 is coupled between a power rail VDD and the floating diffusion node FD to reset the FD (e.g., discharge or charge the FD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance output from the pixel. Finally, select transistor T4 selectively couples the output of pixel circuitry 200 to the readout column line under control of a select signal SEL. In one example of a pixel array 305, the TX signal, the RST signal, and the SEL signal are generated by control circuitry 120 illustrated above in FIG. 1.

In operation, the photosensitive elements PD of pixels 308A, 308B, 308C, and 308D each accumulate photogenerated charge carriers in response to the incident light. As discussed above, pixels 308B and 308C both have green (G) color filters 218B and 218C, as shown in FIGS. 2A-2B, disposed along the optical paths to the photosensitive elements PD of pixels 308B and 308C. However, the metal mesh 212 shown in FIGS. 2A-2B having the mesh openings with a size and pitch to block infrared (IR) light is also disposed along the optical path to the photosensitive element PD of pixel 308C. In the example, the metal mesh 212 is not disposed along the optical path to the photosensitive element PD of pixel 308B. As a result, there will be a difference in accumulated charge between the photosensitive elements PD of pixels 308B and 308C because pixel 308B is exposed to infrared (IR) light and pixel 308C is shielded from being exposed to infrared (IR) light due to metal mesh 212 in accordance with the teachings of the present invention. Therefore, by comparing the accumulated charge difference between the green (G) pixel 308B with metal mesh 212 and the green (G) pixel 308B without metal mesh 212, the infrared (IR) light signal level can be determined in accordance with the teachings of the present invention.

In the case of the incident green (G) light is sensed by pixel array 305, both green (G) pixels 308B and 308C function as standard green (G) pixels even though one of two green (G) pixels 308C has metal mesh 212 because the green (G) light will propagate through metal mesh 212 with little loss, because the metal mesh 212 is a band pass filter designed to block only infrared (IR) light in accordance with the teachings of the present invention. In the case of the incident infrared (IR) light that is detected by pixel array 305, the green (G) pixel 308C with the metal mash 212 will have less accumulated charge because the most of the incident infrared (IR) light is blocked by the metal mesh 212 in accordance with the teachings of the present invention.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:

1. An image sensor, comprising:
a pixel array including a plurality of pixels arranged in a semiconductor layer;
a color filter array including a plurality of groupings of filters disposed over the pixel array, wherein each filter is optically coupled to a corresponding one of the plurality of pixels, wherein each one of the plurality of groupings of filters includes a first, a second, a third, and a fourth filter having a first, a second, the second, and a third color, respectively, and wherein each one of the plurality of groupings of filters forms a 2×2 Bayer pattern, wherein the first filter is next to the second filter and the third filter, the second filter is next to the first filter and the fourth filter, the third filter is next to the first filter and the fourth filter, and the fourth filter is next to the second filter and the third filter; and
a metal layer disposed between the third filter in the color filter array and the pixel array, wherein the metal layer is patterned to include a metal mesh having mesh openings with a size and pitch to block incident light having a fourth color from reaching the corresponding pixel through the third filter of each one of the plurality of groupings of filters, wherein the first color is red, wherein the second color is green, wherein the third color is blue, and wherein the fourth color is infrared, and wherein the metal layer is patterned to include openings without the metal mesh to allow the incident light to reach the corresponding pixels through the first, second, and fourth filters of each one of the plurality of groupings of filters.

2. The image sensor of claim 1 wherein each one of the plurality of pixels includes a photosensitive element coupled to accumulate photogenerated charge carriers in response to the incident light, wherein the image sensor is coupled to sense the fourth color in the incident light in response to a difference in accumulated charge between a pixel corresponding to the second filter and a pixel corresponding to the third filter in each one of the plurality of groupings.

3. The image sensor of claim 1 wherein the image sensor is coupled to sense the second color in the incident light in response to accumulated charge in a pixel corresponding to the second filter and a pixel corresponding to the third filter in each one of the plurality of groupings.

4. The image sensor of claim 1 further comprising an array of microlenses disposed over the pixel array to direct the incident light towards the pixel array.

5. The image sensor of claim 1 wherein metal mesh comprises a resonant band pass filter having mesh openings with a size and pitch to reduce infrared light from passing through metal mesh.

6. The image sensor of claim 1 wherein the pixel array is adapted to be illuminated with the incident light through a back side of an integrated circuit chip including the image sensor.

7. An imaging system, comprising:
a pixel array including a plurality of pixels arranged in a semiconductor layer;
a color filter array including a plurality of groupings of filters disposed over the pixel array, wherein each filter is optically coupled to a corresponding one of the plurality of pixels, wherein each one of the plurality of groupings of filters includes a first, a second, a third, and a fourth filter having a first, a second, the second, and a third color, respectively, and wherein each one of the plurality of groupings of filters forms a 2×2 Bayer pattern, wherein the first filter is next to the second filter and the third filter, the second filter is next to the first filter and the fourth filter, the third filter is next to the first filter and the fourth filter, and the fourth filter is next to the second filter and the third filter;

a metal layer disposed between the third filter in the color filter array and the pixel array, wherein the metal layer is patterned to include a metal mesh having mesh openings with a size and pitch to block incident light having a fourth color from reaching the corresponding pixel through the third filter of each one of the plurality of groupings of filters, wherein the first color is red, wherein the second color is green, wherein the third color is blue, and wherein the fourth color is infrared, and wherein the metal layer is patterned to include openings without the metal mesh to allow the incident light to reach the corresponding pixels through the first, second, and fourth filters of each one of the plurality of groupings of filters;

control circuitry coupled to the pixel array to control operation of the pixel array; and readout circuitry coupled to the pixel array to readout image data from the plurality of pixels.

8. The imaging system of claim 7 further comprising function logic coupled to the readout circuitry to store the image data readout from the plurality of pixels.

9. The imaging system of claim 7 wherein each one of the plurality of pixels includes a photosensitive element coupled to accumulate photogenerated charge carriers in response to the incident light, wherein the image sensor is coupled to sense the fourth color in the incident light in response to a difference in accumulated charge between a pixel corresponding to the second filter and a pixel corresponding to the third filter in each one of the plurality of groupings.

10. The imaging system of claim 7 wherein the image sensor is coupled to sense the second color in the incident light in response to accumulated charge in a pixel corresponding to the second filter and a pixel corresponding to the third filter in each one of the plurality of groupings.

11. The imaging system of claim 7 further comprising an array of microlenses disposed over the pixel array to direct the incident light towards the pixel array.

12. The imaging system of claim 7 wherein metal mesh comprises a resonant band pass filter having mesh openings with a size and pitch to reduce infrared light from passing through metal mesh.

13. The imaging system of claim 7 wherein the pixel array is adapted to be illuminated with the incident light through a back side of an integrated circuit chip including the pixel array.

14. The imaging system of claim 7 wherein the metal layer is disposed in an oxide layer between the color filter array and the semiconductor layer, and wherein the oxide layer contacts the color filter array and the semiconductor layer.

* * * * *